United States Patent
Uchida

(10) Patent No.: US 9,318,243 B2
(45) Date of Patent: Apr. 19, 2016

(54) CONDUCTIVE-PATTERN FORMING METHOD AND COMPOSITION FOR FORMING CONDUCTIVE PATTERN BY PHOTO IRRADIATION OR MICROWAVE HEATING

(71) Applicant: SHOWA DENKO K.K., Minato-ku, Tokyo (JP)

(72) Inventor: Hiroshi Uchida, Tokyo (JP)

(73) Assignee: SHOWA DENKO K.K., Tokyo (JP)

( * ) Notice: Subject to any disclaimer, the term of this patent is extended or adjusted under 35 U.S.C. 154(b) by 0 days.

(21) Appl. No.: 14/359,958

(22) PCT Filed: Nov. 26, 2012

(86) PCT No.: PCT/JP2012/080468
§ 371 (c)(1),
(2) Date: May 22, 2014

(87) PCT Pub. No.: WO2013/077448
PCT Pub. Date: May 30, 2013

(65) Prior Publication Data
US 2015/0024120 A1    Jan. 22, 2015

(30) Foreign Application Priority Data

Nov. 24, 2011 (JP) ................. 2011-256252

(51) Int. Cl.
*C09D 11/52* (2014.01)
*H01B 1/22* (2006.01)
(Continued)

(52) U.S. Cl.
CPC ............ *H01B 13/003* (2013.01); *C09D 11/037* (2013.01); *C09D 11/52* (2013.01);
(Continued)

(58) Field of Classification Search
CPC ........ C09D 11/52; H01B 1/22; H01B 13/003; H05K 1/095; H05K 1/097; H05K 3/1283; H05K 2201/0257
USPC ........................................ 106/31.92; 252/512
See application file for complete search history.

(56) References Cited

U.S. PATENT DOCUMENTS 4,072,771 A * 2/1978 Grier, Sr. ....................... 252/512
5,062,891 A * 11/1991 Gruber et al. .............. 106/31.92
(Continued)

FOREIGN PATENT DOCUMENTS

EP    2 234 119 A1    9/2010
JP    2004-319781 A   11/2004
(Continued)

OTHER PUBLICATIONS

Extended European Search Report dated Mar. 27, 2015 from the European Patent Office in counterpart Application No. 12851695.2.
(Continued)

*Primary Examiner* — Helene Klemanski
(74) *Attorney, Agent, or Firm* — Sughrue Mion, PLLC

(57) ABSTRACT

Provided are a conductive pattern forming method and a composition for forming a conductive pattern by photo irradiation or microwave heating, capable of increasing the conductivity of the conductive pattern. A conductive pattern is formed by preparing a composition for forming a conductive pattern comprising, copper particles each having a copper oxide thin film on the entirety or a part of the surface thereof, copper oxide particles, a reducing agent such as a polyhydric alcohol, a carboxylic acid, or a polyalkylene glycol, and a binder resin; forming a printed pattern having any selected shape on a substrate using this composition for forming a conductive pattern; and subjecting the printed pattern to photo irradiation or microwave heating to generate a sintered body of copper.

9 Claims, 2 Drawing Sheets

(51) Int. Cl.
*H01B 13/00* (2006.01)
*H05K 1/09* (2006.01)
*H05K 3/12* (2006.01)
*C09D 11/037* (2014.01)
*C09D 17/00* (2006.01)

(52) U.S. Cl.
CPC ............... *C09D 17/00* (2013.01); *H01B 1/22* (2013.01); *H05K 1/095* (2013.01); *H05K 3/1283* (2013.01); *H05K 2201/0218* (2013.01); *H05K 2201/0257* (2013.01)

(56) References Cited

U.S. PATENT DOCUMENTS

| | | | |
|---|---|---|---|
| 7,608,204 B2* | 10/2009 | Kim et al. | 252/512 |
| 2006/0159838 A1* | 7/2006 | Kowalski et al. | 427/58 |
| 2006/0163744 A1* | 7/2006 | Vanheusden et al. | 257/773 |
| 2008/0169122 A1* | 7/2008 | Shiraishi et al. | 252/514 |
| 2008/0286488 A1* | 11/2008 | Li et al. | 427/557 |
| 2009/0004445 A1* | 1/2009 | Park et al. | 106/31.92 |
| 2009/0181184 A1* | 7/2009 | Pope et al. | 427/554 |
| 2009/0274833 A1 | 11/2009 | Li et al. | |
| 2009/0311440 A1* | 12/2009 | Li et al. | 427/553 |
| 2010/0025088 A1* | 2/2010 | Kamata et al. | 174/256 |
| 2010/0098874 A1 | 4/2010 | Schroder | |
| 2011/0038974 A1 | 2/2011 | Schroder et al. | |
| 2011/0262657 A1 | 10/2011 | Pope et al. | |
| 2012/0125659 A1* | 5/2012 | Nakako et al. | 427/98.4 |
| 2012/0175147 A1* | 7/2012 | Nakako et al. | 174/133 R |
| 2014/0308460 A1* | 10/2014 | Uchida | 427/557 |
| 2014/0332734 A1* | 11/2014 | Uchida | 252/514 |

FOREIGN PATENT DOCUMENTS

| | | |
|---|---|---|
| JP | 2006-173408 A | 6/2006 |
| JP | 2008-522369 A | 6/2008 |
| JP | 2008-293821 A | 12/2008 |
| JP | 2009-283547 A | 12/2009 |
| JP | 2010-118449 A | 5/2010 |
| JP | 2010-528428 A | 8/2010 |
| JP | 2011-047003 A | 3/2011 |
| JP | 2011-060654 A | 3/2011 |
| WO | 2010/045639 A1 | 4/2010 |
| WO | 2010/110969 A1 | 9/2010 |

OTHER PUBLICATIONS

Written Opinion dated Feb. 12, 2013, issued by the International Searching Authority in corresponding International Application No. PCT/JP2012/080468.
Machine Translation of JP 2009-283547 published Dec. 3, 2009.
Machine Translation of JP 2011-060654 published Mar. 24, 2011.
Machine Translation of JP 2010-118449 published May 27, 2010.
Machine Translation of JP 2011-047003 published Mar. 10, 2011.
Machine Translation of JP 2004-319781 published Nov. 11, 2004.
Machine Translation of JP 2006-173408 published Jun. 29, 2006.
Machine Translation of JP 2008-293821 published Dec. 4, 2008.
International Search Report for PCT/JP2012/080468, dated Feb. 12, 2013.
Communication dated Jul. 30, 2015 from the Korean Intellectual Property Office issued in corresponding Korean application No. 10-2014-7013104.
Taiwanese Office Action issued in TW Application No. 101143970, dated Jan. 7, 2016 with an English language translation.

* cited by examiner

CONDUCTIVE-PATTERN FORMING METHOD AND COMPOSITION FOR FORMING CONDUCTIVE PATTERN BY PHOTO IRRADIATION OR MICROWAVE HEATING

CROSS REFERENCE TO RELATED APPLICATIONS

This application is a National Stage of International Application No. PCT/JP2012/080468, filed Nov. 26, 2012, claiming priority from Japanese Patent Application No. 2011-256252, filed Nov. 24, 2011, the contents of all of which are incorporated herein by reference in their entirety.

TECHNICAL FIELD

The present disclosure relates to the improvement of a conductive pattern forming method and a composition for forming a conductive pattern by photo irradiation or microwave heating.

BACKGROUND ART

Conventionally, as a technology for producing a fine wiring pattern, a method for forming a wiring pattern by combining a copper foil and photoresist and using lithography, has been generally used. However, this method has a large number of steps, and puts a large burden on drainage and liquid waste disposal. Thus, improvement in terms of environment has been desired. In addition, a method for patterning a metal thin film made by heating deposition or sputtering, using a photolithography method, is also known. However, a vacuum environment is necessary for the heating deposition and sputtering, and the cost therefor is very expensive. Thus, when this method is applied to form a wiring pattern, reduction of the production cost is quite difficult.

Thus, a technology for producing a wiring pattern by printing, using metal ink (including ink in which an oxide is metallized by reducing with a reducing agent), has been proposed. The wiring technology by printing enables the production of a large amount of products at a low cost and at high speed, and thus, the technology has already been examined for producing a practical electronic device.

However, the method for heating and sintering metal ink using a heating furnace has drawbacks that a heating process takes time, and that when a plastic substrate is not resistant to the heating temperature necessary for sintering the metal ink, sintering has to be performed at a temperature the plastic substrate is resistant, and thus, the conductivity cannot reach a satisfactory level.

As described in Patent Documents 1 to 3, using a composition (ink) including nano-particles, and transforming the ink to metal wiring by photo irradiation have been tried.

The method using optical energy or microwave for heating is a very good method because only ink portions can be heated. However, the method has drawbacks that when metal particles themselves are used, the conductivity of the obtained conductive pattern cannot be increased to a satisfactory level, and when a copper oxide is used, the obtained conductive pattern has a large void ratio and a part of the copper oxide particles remain unreduced.

Further, there are further drawbacks that metal or metal oxide particles having a diameter of 1 μm or less should be used for sintering, and preparing such nano-particles requires a very high cost.

PRIOR ARTS

Patent Document

Patent Document 1: JPT 2008-522369
Patent Document 2: WO 2010/110969
Patent Document 3: JPT 2010-528428

SUMMARY

In general, with respect to a conductive pattern formed on a substrate, the higher the conductivity (the lower the volume resistivity), the higher the performance. Therefore, it is preferable that the conductive pattern formed by the conventional technology has an increased conductivity.

An objective of the present disclosure is to provide a conductive pattern forming method and a composition for forming a conductive pattern by photo irradiation or microwave heating, capable of improving the conductivity of the conductive pattern.

In order to attain the above objective, an embodiment of the present disclosure is a composition for forming a conductive pattern by photo irradiation or microwave heating, comprising copper particles each having a copper oxide thin film formed on the entirety or a part of the surface, copper oxide particles having a smaller diameter than that of the copper particles, a reducing agent, and a binder resin.

The copper particles have a number median particle diameter D50 of 100 nm to 10 μm, and the copper oxide particles have a number median particle diameter D50 of 5 nm to 1000 nm.

Further, the mass ratio of the copper particles and the copper oxide particles is represented by copper particles: copper oxide particles=98:2 to 50:50.

Further, the copper oxide particles are copper (I) oxide particles, copper (II) oxide particles, or a mixture of these particles.

Also, the reducing agent is a polyhydric alcohol, a carboxylic acid, or a polyalkylene glycol.

Also, the copper particles may preferably have a number median particle diameter D50 of 500 nm to 3 μm.

In addition, the ratio of copper oxide in the copper particles is 20% by mass or less relative to the total mass of metal copper and copper oxides.

Further, an embodiment of the present disclosure is a conductive pattern forming method comprising: preparing any one of the above compositions for forming a conductive pattern, and subjecting the composition for forming a conductive pattern to photo irradiation or microwave heating.

Further, the light to be irradiated to the composition for forming a conductive pattern is a pulsed light having a wavelength of 200 to 3000 nm.

The microwave to heat the composition for forming a conductive pattern has a wavelength of 1 m to 1 mm.

DETAILED DESCRIPTION

Figure 1:
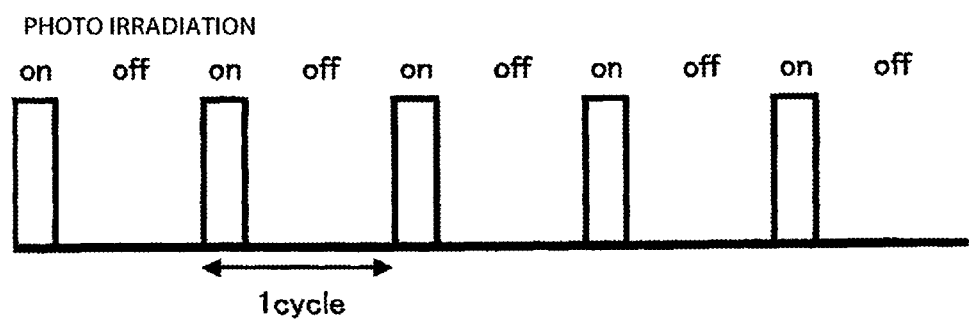
FIG. 1 is a diagram illustrating the definition of pulsed light.

An exemplary embodiment (hereinafter, referred to as embodiment) of the present disclosure will be described below.

A composition for forming a conductive pattern by photo irradiation or microwave heating according to the present embodiment is characterized in comprising copper particles each having a copper oxide thin film formed on the entirety or a part of the surface, copper oxide particles having a smaller diameter than that of the copper particles, a reducing agent, and a binder resin.

The conductive pattern forming method according to the present embodiment is characterized in comprising, preparing the composition for forming a conductive pattern, and subjecting the composition for forming a conductive pattern to photo irradiation or microwave heating. Here, preparation refers to forming a composition layer having any selected shape on an appropriate substrate with the composition for forming a conductive pattern, by, for example, screen printing, gravure printing, and the like, or using a printing device such as an inkjet printer. More specifically, preparation refers to forming a printed pattern with the composition for forming a conductive pattern, forming the composition layer over the entire surface of the substrate (forming an entire surface pattern), or the like. In the present specification, the conductive pattern refers to a conductive film which is a conductive metal thin film made of metal formed into a pattern (including the entire surface pattern), the thin film being made by forming a printed pattern with a composition comprising a binder resin having copper particles and copper oxide particles dispersed therein, subjecting the printed pattern to photo irradiation, and sintering the copper particles and the copper oxide particles.

The copper particles may preferably have a particle diameter of 100 nm to 10 μm, more preferably 200 nm to 5 μm, and further more preferably 500 nm to 3 μm. The thin copper oxide film which is present on the entirety or a part of the surface of the copper particle may be copper (I) oxide (cuprous oxide) or copper (II) oxide (cupric oxide). With respect to the copper oxide ratio, according to XRD analysis, the ratio of the copper oxide (copper oxide/(metal copper+copper oxide)) may be 20% by mass or less, preferably 5% by mass or less, and more preferably 3% by mass or less. If the ratio exceeds 20% by mass, the volume resistivity decrease rate of the formed conductive film becomes lower. With the proviso that, in order to ensure the reactive property between the copper particles and the copper oxide particles by photo irradiation or microwave heating, the ratio of the copper oxide may be 0.01% by mass or more. The copper oxide is effective even if only a very small amount of the copper oxide is present on the surface, and the copper oxide is preferably present in the above-mentioned ratio. Further, even if the amount of copper oxide is too small to be detected by XRD at the beginning, the copper oxide may be generated by surface oxidation caused during ink preparation in the air and a printing process, and such generated copper oxides may be also used. When a copper particle is exposed to air, a thin film of copper oxide is formed on the surface.

When the copper particle is smaller than 100 nm, a specific surface area becomes larger, and the copper particle is very easily oxidized. Thus, using the particle as a metal copper particle becomes difficult. When the copper particle is in the range of 100 nm to 500 nm, the copper particle may be used as metal copper, but may be gradually oxidized when the copper particle is left in the air. Therefore, there are drawbacks that the ink largely changes over time and cannot be practically used. Also, there are further drawbacks that, when the particle diameter exceeds 10 μm, fine patterned printing may not be performed, and when the particle diameter exceeds 3 μm, uniform dispersion of such copper particles with the copper oxide particles having a small particle diameter is very difficult, and a dispersant and optimization of preparation ratio are required.

In addition, the above copper oxide particles to be used have a particle diameter smaller than the particle diameter of the copper particles. The copper oxide particles preferably have a particle diameter of 5 nm to 1000 nm, and more preferably, 10 nm to 500 nm. The copper oxide particles may be either copper (I) oxide particles or copper (II) oxide particles, or a mixture of these particles.

When the copper oxide particle has a particle diameter exceeding 1000 nm, completing the reduction becomes difficult. When the copper oxide particle has a particle diameter of 5 nm or less, preparation becomes difficult.

Particle diameters of the copper particle and the copper oxide particle are the number median particle diameters D50, obtained by measuring diameters using laser diffraction-scattering when the particle diameter is 500 nm or more, and using dynamic light scattering when the particle diameter is less than 500 nm.

The mixing ratio (mass ratio) of copper particles to copper oxide particles in the composition for forming a conductive pattern is preferably represented by copper particles:copper oxide particles=98:2 to 50:50, and more preferably, 95:5 to 70:30.

The light to be irradiated to the composition for forming a conductive pattern may be a pulsed light having a wavelength of 200 nm to 3000 nm. In the present specification, the "pulsed light" is a light having a short photo irradiation period (irradiation time) of several microseconds to several tens of milliseconds. When a plurality of times of photo irradiation are repeated, as shown in FIG. 1, there is a period in which photo irradiation is not performed (irradiation interval (off)) between a first photo irradiation period (on) and a second photo irradiation period (on). In FIG. 1, the pulsed light is illustrated to have a constant light intensity, but the light intensity may vary within one photo irradiation period (on). The pulsed light is irradiated from a light source provided with a flash lamp such as a xenon flash lamp. Using such a light source, pulsed light is irradiated to a layer of the composition for forming a conductive pattern. When irradiation is repeated for n-times, one cycle (on+off) in FIG. 1 is repeated for n-times. At the time of repeated irradiation, it is preferable to cool from the substrate side so that the substrate can be cooled to a temperature near the room temperature when the next pulsed light irradiation is performed.

One irradiation period (on) of the pulsed light is preferably from about 20 microseconds to about 10 milliseconds. If the period is less than 20 microseconds, sintering does not progress, resulting in providing a lower effect in increasing the performance of a conductive pattern. If the period is longer than 10 milliseconds, there may be bad influences greater than good effect on the substrate due to photodegradation and thermal degradation. A single shot of the pulsed light is effective, but the irradiation may be repeated as mentioned above. When the irradiation is repeated, the irradiation interval (off) is preferably in a range from 20 microseconds to 30 seconds, and more preferably in a range from 2000 microseconds to 5 seconds. If the irradiation interval is shorter than 20 microseconds, the pulsed light becomes similar to a continuous light and another irradiation is performed after one irradiation without leaving enough time for cooling. Thus, the substrate may be heated to a high temperature and deteriorated. The irradiation interval is longer than 30 seconds, the substrate is further cooled while being left the effect obtained by repeating is decreased although not completely lost.

Also, the composition for forming a conductive pattern can be heated by microwave. When the composition for forming a conductive pattern is subjected to microwave heating, the microwave to be used is an electromagnetic wave having a wavelength in the range of 1 m to 1 mm (frequency of 300 MHz to 300 GHz).

The substrate is not limited, and for example, a plastic substrate, a glass substrate, a ceramic substrate, and the like can be used.

The reducing agent to be used may be a monohydric alcohol compound, such as methanol, ethanol, isopropyl alcohol, butanol, cyclohexanol, and terpineol; polyhydric alcohol, such as ethylene glycol, propylene glycol, and glycerin; a carboxylic acid, such as formic acid, acetic acid, oxalic acid, and succinic acid; a carbonyl compound, such as acetone, methyl ethyl ketone, benzaldehyde, and octyl aldehyde; an ester compound, such as ethyl acetate, butyl acetate, and phenyl acetate; and a hydrocarbon compound, such as hexane, octane, toluene, naphthalene, decalin, and cyclohexane. Among those mentioned above, polyhydric alcohol, such as ethyleneglycol, propyleneglycol, glycerin and the like, and carboxylic acid, such as formic acid, acetic acid, and oxalic acid are preferable in view of the efficiency of the reducing agent.

In order to print a composition for forming a conductive pattern containing metal copper and copper oxide particles, a binder resin is necessary. It is possible to use a binder resin that also functions as a reducing agent. A polymer compound capable of functioning also as a reducing agent may be a thermoplastic resin or a thermoset resin which is, for example, a poly-N-vinyl compound such as polyvinylpyrrolidone or polyvinyl caprolactone, a polyalkylene glycol compound such as polyethylene glycol, polypropylene glycol, or poly THF, polyurethane, a cellulose compound and a derivative thereof, an epoxy compound, a polyester compound, chlorinated polyolefin, a polyacrylic compound, and the like. Among those mentioned above, polyvinylpyrrolidone, phenoxy type epoxy resin that remains solid at normal temperature, and a cellulose compound are preferable in view of the binder effect, while polyethylene glycol, polypropylene glycol, and a polyurethane compound are preferable in view of the reduction effect. Note that polyethylene glycol and polypropylene glycol are classified in polyhydric alcohol, and each has a particularly preferable property as a reducing agent.

Presence of a binder resin is essential. However, the use of an excessively large amount of binder resin causes a problem that the conductivity is unlikely to be expressed, while the use of an excessively small amount of binder resin lowers the ability of connecting particles. In view of the above, the amount of binder resin to be used is, preferably, 1 to 50% by mass, more preferably, 3 to 20% parts by mass, relative to the total amount of the metal copper and the copper oxide particles.

Although different solvents may be used depending on a desired printing method, a publicly known organic solvent, a water solvent, or the like can be used.

Note that a composition for forming a conductive pattern according to the present embodiment may contain a publicly known ink additive (antifoaming agent, surface modifier, thixotropic agent, and the like).

Unlike the present disclosure, when a conductive pattern is formed by photo irradiation using only copper particles (particles of metal copper), since a copper oxide layer is present on the surface of the copper particle, when a reducing agent such as polyhydric alcohol is mixed to the copper particles and the mixture is subjected to photo irradiation, the mixture is heated and sintered while the copper oxide present on the surface of the copper particles is reduced, and thus, a sintered body of copper can be generated. However, the conductive pattern formed by this method cannot have a sufficiently decreased volume resistivity. This is because the copper particle has metal copper itself in the inside of the particle, and the metal copper has a melting point of 1084.6° C. Thus, when the particle has a diameter of several hundred nm or more, the particle is not deformed at the time of sintering by photo irradiation, and the contact area between particles cannot be enlarged.

When a conductive pattern is formed by photo irradiation using only copper oxide particles, a reducing agent such as polyhydric alcohol is mixed to the copper oxide particles, the mixture is subjected to photo irradiation to heat and sinter the mixture while reducing the copper oxides, and thereby, a sintered body of copper can be generated. In particular, when a copper oxide particle having a small diameter is used, a metal pattern in which particles are continuously connected is provided by chemical reduction sintering. However, in order to reduce the copper oxide particle to the center thereof, the energy of the light to be irradiated should be increased, and copper oxide particles having a small particle diameter should be used. Therefore, there are drawbacks that a part of the copper oxide particles are blown off during photo irradiation, and providing a conductive pattern having an increased thickness becomes difficult. There are further drawbacks that since oxygen may be lost during sintering, and the specific gravity is different between copper oxide and metal copper (copper oxide has d=6.31, whereas metal copper has d=8.94), large volume contraction occurs during the sintering process, and thus, although sintered bodies themselves are connected, a void can be easily generated in the sintered body. The presence of a void is not preferable because not only that the volume resistivity is increased, but also that the strength is decreased. Further, since the energy of the light to be irradiated is large, the energy cost is increased.

The present embodiment is characterized in that a composition for forming a conductive pattern formed by mixing copper particles, copper oxide particles, a reducing agent, and a binder resin is subjected to photo irradiation or microwave heating to generate a sintered body of copper and form a conductive pattern. In this case, photo irradiation or microwave heating is performed when the reducing agent is present, and thus, the copper oxide particles are reduced to become metal copper. Also, the copper oxide layer present on the surface of the copper particle is reduced to metal copper. During this process, metal copper particles generated by reducing the copper oxide particles are placed to fill the gaps between the copper particles, and sintered, the copper particle having comparatively large diameter than the copper oxide particle. Accordingly, metal copper generated by reducing the copper oxide particles is sintered around the copper particles, and thus, the resistance value can be sufficiently reduced.

In addition, by using both the copper particles and the copper oxide particles, the ratio of copper oxide can be made low, resulting in lowering the energy of light to be irradiated, and reducing the energy cost. Further, because the energy of the light to be irradiated is low and the copper particles having a large specific gravity (d=8.94) are present, the copper oxide particle having a small specific gravity (d=6.31) can be prevented from being blown off during the photo irradiation. Therefore, the conductive film may have a large thickness. Also, because reduction of the inside of the copper particle is not necessary, copper particles having a large diameter can be used in accordance with the line width of the printed pattern. This is advantageous for increasing the thickness of the conductive pattern.

The composition for forming a conductive pattern according to the present embodiment may contain a known ink additive (antifoaming agent, surface modifier, thixotropic agent, and the like), in accordance with needs.

EXAMPLES

Hereinafter, specific examples of the present disclosure will be explained. The examples are described below for the purpose of easy understanding of the present disclosure, and the present disclosure is not limited to these examples.

Further, in Examples and Comparative Examples described below, volume resistivity was measured using Loresta GP manufactured by Mitsubishi Chemical Analytech Co., Ltd. SEM images were captured using FE-SEM S-5200 manufactured by Hitachi High-Technologies Corporation. XRD (X-ray diffraction) was measured by Ultima IV manufactured by Rigaku Corporation. Particle diameters of respective particles were measured using Microtrac Particle Size Distribution Measurement Device MT3000II Series USVR (a laser diffraction-scattering method) or Nanotrac UPA-EX150 (a dynamic light scattering method) manufactured by Nikkiso Co., Ltd., and particle diameters were obtained by spherical approximation, and the median diameter was determined as D50.

Example 1

Polyvinylpyrrolidone (made by Nippon Shokubai Co., Ltd.) as a binder resin was dissolved into a mixed aqueous solution of ethyleneglycol and glycerin (a reagent made by Kanto Chemical Co., Inc.) as a reducing agent to prepare a binder resin solution of 40 mass %. Mass ratio of the mixed aqueous solution is represented by ethyleneglycol:glycerin:water=70:15:15. Then, 1.5 g of this solution was mixed with 0.5 g of the above mentioned mixed aqueous solution, into which 5.4 g of copper powder 1020Y (spherical, D50=380 nm) made by Mitsui Mining and Smelting Co., Ltd. and 0.6 g of copper oxide particles NanoTek CuO (spherical, D50=270 nm) made by C. I. Kasei Co., Ltd. were mixed (copper particles:copper oxide particles=90:10), and well mixed using Planetary Centrifugal Vacuum Mixer Awatori Rentaro ARV-310 (manufactured by Thinky Corporation) to prepare a paste for printing (composition for forming a conductive pattern).

The obtained paste was printed on a polyimide film (Kapton 100N, made by Du Pont-Toray Co., Ltd., 25 μm in thickness) in a 2 cm×2 cm square pattern by means of screen printing. Then, a pulsed light was irradiated to the sample obtained as described above, using Sinteron 3300 manufactured by Xenone, to thereby convert the printed pattern into a conducive pattern. Irradiation conditions included a pulsed width of 2000 microseconds, a voltage of 3000 V, and single-shot irradiation with an irradiation distance 20 cm. The pulse energy at that time was 2070 J. The thickness of the conductive pattern formed as described above was 25 μm. The above described series of processing was performed in air.

Example 2

5.4 g of copper powder 1050Y (spherical, D50=716 nm) made by Mitsui Mining & Smelting Co., Ltd. and 0.6 g of copper oxide particles NanoTek CuO (spherical, D50=270 nm) made by C. I. Kasei Co., Ltd. were used to prepare a paste for printing in the same manner as that in Example 1. The obtained paste was printed in a pattern in the same manner as that in Example 1, and subjected to photo irradiation. The thickness of the obtained conductive pattern was 17 μm.

Example 3

5.4 g of copper powder 1050YP (flat, D50=1080 nm) made by Mitsui Mining & Smelting Co., Ltd. and 0.6 g of copper oxide particles NanoTek CuO (spherical, D50=270 nm) made by C. I. Kasei Co., Ltd. were used to prepare a paste for printing in the same manner as that in Example 1. The obtained paste was printed in a pattern in the same manner as that in Example 1, and subjected to photo irradiation. The thickness of the obtained conductive pattern was 19 μm.

Example 4

5.4 g of copper powder 1100Y (spherical, D50=1110 nm) made by Mitsui Mining & Smelting Co., Ltd. and 0.6 g of copper oxide particles NanoTek CuO (spherical, D50=270 nm) made by C. I. Kasei Co., Ltd. were used to prepare a paste for printing in the same manner as that in Example 1. The obtained paste was printed in a pattern in the same manner as that in Example 1, and subjected to photo irradiation. The thickness of the obtained conductive pattern was 24 μm.

Example 5

5.4 g of copper powder 1110YP (flat, D50=1200 nm) made by Mitsui Mining & Smelting Co., Ltd. and 0.6 g of copper oxide particles NanoTek CuO (spherical, D50=270 nm) made by C. I. Kasei Co., Ltd. were used to prepare a paste for printing in the same manner as that in Example 1. The obtained paste was printed in a pattern in the same manner as that in Example 1, and subjected to photo irradiation. The thickness of the obtained conductive pattern was 20 μm.

Example 6

5.4 g of copper powder 1400Y (spherical, D50=5700 nm) made by Mitsui Mining & Smelting Co., Ltd. and 0.6 g of copper oxide particles NanoTek CuO (spherical, D50=270 nm) made by C. I. Kasei Co., Ltd. were used to prepare a paste for printing in the same manner as that in Example 1. The obtained paste was printed in a pattern in the same manner as that in Example 1, and subjected to photo irradiation. The thickness of the obtained conductive pattern was 22 μm.

Example 7

5.4 g of copper powder MA-004J (atomized powder, D50=4640 nm) made by Mitsui Mining & Smelting Co., Ltd. and 0.6 g of copper oxide particles NanoTek CuO (spherical, D50=270 nm) made by C. I. Kasei Co., Ltd. were used to prepare a paste for printing in the same manner as that in Example 1. The obtained paste was printed in a pattern in the same manner as that in Example 1, and subjected to photo irradiation. The thickness of the obtained conductive pattern was 26 μm.

Example 8

5.4 g of copper powder 1030Y (spherical, D50=500 nm) made by Mitsui Mining & Smelting Co., Ltd. and 0.6 g of copper oxide particles NanoTek CuO (spherical, D50=270 nm) made by C. I. Kasei Co., Ltd. were used to prepare a paste for printing in the same manner as that in Example 1. The obtained paste was printed in a pattern in the same manner as that in Example 1, and subjected to photo irradiation. The thickness of the obtained conductive pattern was 21 μm.

Comparative Example 1

5.4 g of copper powder 1020Y (spherical, D50=380 nm) made by Mitsui Mining & Smelting Co., Ltd. and 0.6 g of copper oxide particles FCO-500 (spherical, D50=3850 nm) made by Furukawa Chemicals Co., Ltd. were used to prepare a paste for printing in the same manner as that in Example 1. The obtained paste was printed in a pattern in the same manner as that in Example 1, and subjected to photo irradiation. The thickness of the obtained conductive pattern was 21 μm.

Comparative Example 2

5.4 g of copper powder 1020Y (spherical, D50=380 nm) made by Mitsui Mining & Smelting Co., Ltd. and 0.6 g of copper oxide particles 1-550 (spherical, D50=720 nm) made by Furukawa Chemicals Co., Ltd. were used to prepare a paste for printing in the same manner as that in Example 1.

The obtained paste was printed in a pattern in the same manner as that in Example 1, and subjected to photo irradiation. The thickness of the obtained conductive pattern was 23 μm.

Comparative Example 3

6.0 g of copper powder 1020Y (spherical, D50=380 nm) made by Mitsui Mining & Smelting Co., Ltd. was used (without using copper oxide) to prepare a paste for printing in the same manner as that in Example 1. The obtained paste was printed in a pattern in the same manner as that in Example 1, and subjected to photo irradiation. The thickness of the obtained conductive pattern was 22 μm.

Comparative Example 4

6.0 g of copper oxide particles NanoTek CuO (spherical, D50=270 nm) made by C. I. Kasei Co., Ltd. was used (without using copper powder) to prepare a paste for printing in the same manner as that in Example 1. The obtained paste was printed in a pattern in the same manner as that in Example 1, and subjected to photo irradiation. The thickness of the obtained conductive pattern was 32 μm.

Comparative Example 5

5.4 g of copper particles formed by oxidizing copper powder 1020Y (spherical, D50=380 nm) made by Mitsui Mining & Smelting Co., Ltd. in air, to have 18.7% by mass of copper (I) oxide, 8.4% by mass of copper (II) oxide, and 72.9% by mass of metal copper, and 0.6 g of copper oxide particles FCO-500 (spherical, D50=3850 nm) made by Furukawa Chemicals Co., Ltd., were used to prepare a paste for printing in the same manner as that in Example 1. The obtained paste was printed in a pattern in the same manner as that in Example 1, and subjected to photo irradiation. The thickness of the obtained conductive pattern was 23 μm.

As to each of the conductive patterns made by the above mentioned steps, volume resistivity was measured using Loresta GP volume resistivity (Ω·cm) made by Mitsubishi Chemical Analytech Co., Ltd. The results are shown in Table 1.

TABLE 1

|  | Cu Particles | CuO Particles | Ratio Cu | CuO | Conductive Film Thickness μm | Volume Resistivity Ω·cm | MIT Test 100 times |
|---|---|---|---|---|---|---|---|
| Example 1 | 1020Y | NanoTek CuO | 90 | 10 | 25 | 4.64E−04 | Conductive |
| Example 2 | 1050Y | NanoTek CuO | 90 | 10 | 17 | 1.50E−04 | Conductive |
| Example 3 | 1050YP | NanoTek CuO | 90 | 10 | 19 | 2.39E−04 | Conductive |
| Example 4 | 1100Y | NanoTek CuO | 90 | 10 | 24 | 3.66E−04 | Conductive |
| Example 5 | 1100YP | NanoTek CuO | 90 | 10 | 20 | 8.31E−04 | Conductive |
| Example 6 | 1400Y | NanoTek CuO | 90 | 10 | 22 | 5.24E−03 | Conductive |
| Example 7 | MA-C04J | NanoTek CuO | 90 | 10 | 26 | 2.08E−03 | Conductive |
| Example 8 | 1030Y | NanoTek CuO | 90 | 10 | 21 | 4.64E−04 | Conductive |
| Comparative Example 1 | 1020Y | FCO-500 | 90 | 10 | 21 | 8.24E−02 | Conductive |
| Comparative Example 2 | 1020Y | 1-550 | 90 | 10 | 23 | 1.58E−02 | Conductive |
| Comparative Example 3 | 1020Y | None | 100 | 0 | 22 | 3.45E−02 | Conductive |
| Comparative Example 4 | None | NanoTek CuO | 0 | 100 | 32 | 6.71E−04 | Not Conductive |
| Comparative Example 5 | Oxidized 1020Y | FCO-500 | 90 | 10 | 23 | 3.46E−03 | Conductive |

The MIT test shown in Table 1 was a folding endurance test of a conductive pattern formed on a substrate (polyimide film). The test was performed, using a MIT folding endurance tester manufactured by MYS Tester Co., Ltd., under the test conditions including 0.38 mm folding clamp tip, 0.25 mm gap, 10N load, 135-degree right-left bending angle, and a bending speed of 10 times per minute. The test sample was a wire formed by printing a liner pattern of 100 mm×0.2 mm on the polyimide substrate and subjecting the pattern to photo sintering under the above conditions. Conductivities of the test samples before and after 100 times of bending in the MIT test were observed.
Conductive: conductivity was maintained
Not Conductive: conductivity was not available due to disconnection after MIT test As shown in Table 1, the volume resistivity of any one of Examples is smaller than that of Comparative Examples 1 to 3. The volume resistivity of each Example 6 and 7 is higher than those of other Examples. This is because the particle diameter (D50) of the copper particle is large exceeding 3 μm. On the other hand, in Example 8 using 1030Y having D50 of 500 nm, a preferable volume resistivity was obtained. Further, conductivity was maintained after the MIT test, except Comparative Example 4.

In Comparative Example 4, the conductive pattern was formed using only copper oxide particles. The volume resistivity (before MIT test) of Comparative Example 4 was preferable. However, the conductive pattern had a high degree of void ratio, and a low mechanical strength, and thus, the conductivity was not observed after the MIT test.

In Comparative Example 5, copper particles same as those used in Example 1 were used, and the copper particles were oxidized in air. Comparative Example 5 had higher volume resistivity than that of Example 1. The reason therefor was that the ratio of copper oxides (copper (I) oxide+copper (II) oxide) present on the surface of the copper particle exceeded 20%.

Figure 2:
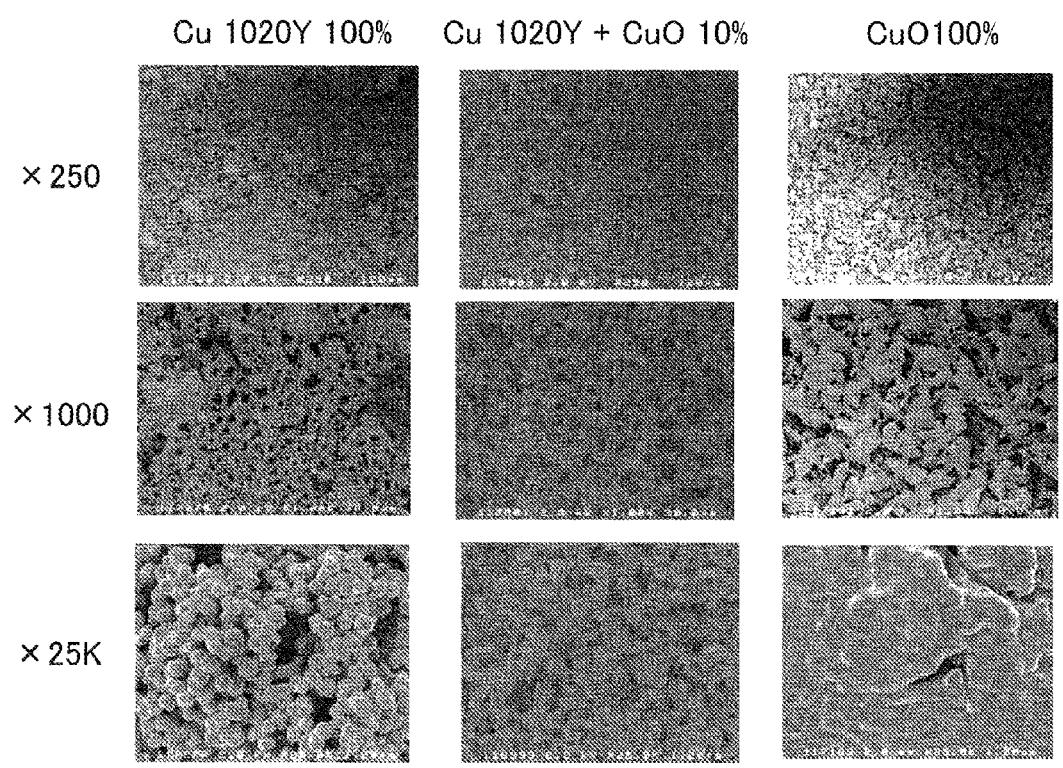
FIG. 2 is a diagram showing surface SEM photographs of the conductive patterns produced according to Examples of the present disclosure.

FIG. 2 shows surface SEM pictures of formed conductive patterns. In FIG. 2, when only copper oxide particles are used (labeled as CuO 100%), many voids are generated (a SEM picture at a lower magnification); when only copper particles are used (labeled as Cu 1020Y 100%), substantially spherical copper particles remain their original shape (a SEM picture at a higher magnification).

Whereas, when copper particles and copper oxide particles are used (labelled as Cu 1020Y+CuO 10%), the number of voids is decreased. This is because the gaps between copper particles are filled with copper particles converted from the copper oxide particles by photo irradiation.

The compositions of copper and copper oxide in the copper particles and the copper oxide particles used in above Examples and Comparative Examples were analyzed by XRD measurement. The results are shown in Table 2.

TABLE 2

| Coexisting Particles | | Particle | | XRD (mass %) | | |
|---|---|---|---|---|---|---|
| | | Shape | D50 (nm) | Cu | Cuprite (Cu$_2$O) | Tenorite (CuO) |
| Cu | 1020Y | Spherical | 380 | 93.1 | 1.9 | 5.0 |
| | 1030Y | Spherical | 500 | | | |
| | 1050Y | Spherical | 716 | | | |
| | 1050YP | Flat | 1080 | | | |
| | 1100Y | Spherical | 1110 | 99.0 | 1.0 | 0.0 |
| | 1100YP | Flat | 1200 | 98.4 | 1.5 | 0.1 |
| | 1400Y | Spherical | 5700 | | | |
| | MA-C04J | Atomized Powder | 4640 | | | |
| CuO | NanoTek CuO | Spherical | 270 | 0.0 | 14.6 | 85.4 |
| | 1-550 | Spherical | 720 | 0.0 | 0.0 | 100.0 |
| | FCO-500 | Spherical | 3850 | 0.0 | 0.0 | 100.0 |

As shown in Table 2, a small amount of copper oxide was contained with the copper powder 1020Y, 1100Y, and 1100YP. This is because the surfaces of the particles are oxidized. With the presence of copper oxide on the copper powder surface, when photo irradiation or microwave heating is performed while a reducing agent is present, the copper oxide particles are reduced to copper, and also, the copper oxide on the copper powder surface is reduced. The copper particles converted from the copper oxide particles during these processes, can be easily attached to the copper powder.

The invention claimed is:

1. A composition for forming a conductive pattern by photo irradiation or microwave heating, comprising,
   copper particles each having a copper oxide thin film on the entirety or a part of a surface thereof,
   copper oxide particles having a diameter smaller than that of the copper particles,
   a reducing agent, and
   a binder resin;
   wherein the copper particles have a number median particle diameter D50 of 100 nm to 10 μm, and the copper oxide particles have a number median particle diameter D50 of 5 nm to 1000 nm.

2. A composition for forming a conductive pattern according to claim 1, wherein a mass ratio of the copper particles and the copper oxide particles is represented by copper particles: copper oxide particles=98:2 to 50:50.

3. A composition for forming a conductive pattern according to claim 1, wherein the copper oxide particles are copper (I) oxide particles, copper (II) oxide particles, or a mixture of these particles.

4. A composition for forming a conductive pattern according to claim 1, wherein the reducing agent is a polyhydric alcohol, a carboxylic acid, or a polyalkylene glycol.

5. A composition for forming a conductive pattern according to claim 1, wherein the copper particles have a number median particle diameter D50 of 500 nm to 3 μm.

6. A composition for forming a conductive pattern according to claim 1, wherein the ratio of copper oxide in the copper particles is 20% by mass or less relative to the total amount of metal copper and copper oxide.

7. A method for forming a conductive pattern comprising, preparing a composition for forming a conductive pattern according to claim 1, and subjecting the composition for forming a conductive pattern to photo irradiation or microwave heating.

8. A conductive pattern forming method according to claim 7, wherein the light to be irradiated to the composition for forming a conductive pattern is a pulsed light having a wavelength of 200 to 3000 nm.

9. A conductive pattern forming method according to claim 7, wherein the microwave to heat the composition for forming a conductive pattern has a wavelength of 1 m to 1 mm.

* * * * *